United States Patent [19]
Suzuki et al.

[11] Patent Number: 6,060,729
[45] Date of Patent: May 9, 2000

[54] LIGHT-EMITTING DEVICE

[75] Inventors: Nobuaki Suzuki; Takehiro Fujii, both of Kyoto, Japan

[73] Assignee: Rohm Co., Ltd., Kyoto, Japan

[21] Appl. No.: 09/196,323

[22] Filed: Nov. 19, 1998

[30] Foreign Application Priority Data

Nov. 26, 1997 [JP] Japan .................................. 9-324021

[51] Int. Cl.[7] ................................................ H01L 33/00
[52] U.S. Cl. .......................... 257/99; 257/98; 257/100; 257/680; 438/22; 438/25; 438/26
[58] Field of Search ............................... 257/98, 100, 99; 257/680; 438/25, 26

[56] References Cited

U.S. PATENT DOCUMENTS

| | | | |
|---|---|---|---|
| 5,298,768 | 3/1994 | Okazaki et al. | 257/81 |
| 5,851,847 | 12/1998 | Yamanaka | 438/26 |
| 5,877,546 | 3/1999 | You | 257/680 |
| 5,925,898 | 7/1999 | Spath | 257/98 |

FOREIGN PATENT DOCUMENTS

| | | | |
|---|---|---|---|
| 359027568 | 2/1984 | Japan | 257/99 |
| 62-12174 | 1/1987 | Japan | 257/98 |
| 5-29650 | 2/1993 | Japan . | |
| 405145121 | 6/1993 | Japan | 257/99 |
| 6-120562 | 4/1994 | Japan . | |
| 7-15046 | 1/1995 | Japan . | |

*Primary Examiner*—David Hardy
*Assistant Examiner*—Huy Bui
*Attorney, Agent, or Firm*—Arent Fox Kintner Plotkin & Kahn PLLC

[57] ABSTRACT

A light-emitting diode chip having an anode electrode and a cathode electrode both arranged on its top surface is placed in a cavity formed in a base board that has conductors so laid as to extend from its top surface to its bottom surface. The anode and cathode electrodes are connected, by way of wires, to the conductors laid on the top surface of the base board, respectively, and then the light-emitting diode chip and the wires are sealed in a resin mold. The electrodes are situated at a level equal to or higher than the top surface of the base board so that the wires can be fixed on the electrodes without interference between the wire-bonding tool and the base board.

7 Claims, 3 Drawing Sheets

LIGHT-EMITTING DEVICE

BACKGROUND OF THE INVENTION

1. Field of the Invention

The present invention relates to a light-emitting device composed of a light-emitting diode, and particularly to a light-emitting device composed of a light-emitting diode chip having an anode electrode and a cathode electrode both arranged on the top surface thereof.

2. Description of the Prior Art

A typical light-emitting diode (LED) that emits light of a relatively long wavelength, such as red or green light, has one electrode on its top surface and another electrode on its bottom surface. A light-emitting diode chip of this type is usually formed into a light-emitting device through a process as described below. First, the LED chip is fixed on a base board with adhesive. This step is called die bonding and, here, a conductive adhesive is used so that, at the same time that the LED chip is fixed on the base board, its bottom-surface electrode will be connected to a metal conductor laid on the base board. Next, the top-surface electrode of the LED chip is connected, by way of a wire of a highly conductive material such as gold, to another metal conductor laid on the base board. This step is called wire bonding. Last, the LED chip thus fixed on the base board is, together with the wire, sealed in a mold of light-permeable resin for protection.

In wire bonding, a tool having the shape of a small-diameter cylinder, called a capillary tool, is used. First, the capillary tool is moved down to the top-surface electrode of the LED chip in such a way that a ball-shaped tip of a wire that sticks out from the lower tip of the capillary tool is pressed against the electrode with a pressure not so strong as to damage the LED chip. Then, from the capillary tool, an ultrasonic wave is applied to the tip of the wire, and thereby the wire is fixed on the electrode. Next, the capillary tool is moved sideways so that it can then be moved down to the corresponding metal conductor formed on the base board, where, by similar application of a pressure and an ultrasonic wave, the wire is connected to the metal conductor and is then cut.

In a light-emitting device manufactured in this way, the LED chip protrudes from the top surface of the base board, and is thus susceptible to an external mechanical force. In particular, a strong mechanical force applied from the side may cause the LED chip, together with the resin mold that is supposed to provide protection thereto, to separate from the base board. It is also possible that the wire is broken midway, or the wire separates, at one or the other end thereof, from the electrode formed on the chip or from the conductor formed on the circuit board. Thus, in conventional light-emitting devices, an external mechanical force often causes imperfect contact.

Japanese Laid-Open Patent Application No. H5-29650 discloses a photointerruptor that has a light-emitting chip and a light-sensing chip placed in a cavity formed in its case, with the cavity filled with light-permeable resin. The cavity has metal conductors laid on its floor surface, and the two chips are, within this cavity, connected individually to those metal conductors in the manner as described above. Specifically, each chip is fixed, by die bonding, on the floor surface of the cavity with conductive adhesive, and thereby the electrode placed on the bottom surface of the chip is connected to a conductor laid on the floor surface of the cavity; on the other hand, the electrode placed on the top surface of the chip is connected, by wire bonding, to another conductor laid on the floor surface of the cavity.

In this photointerruptor, neither the chip nor the wires protrude from the case, and therefore an external mechanical force is unlikely to cause imperfect contact. However, those wires, which are used to achieve electrical connection within the cavity formed in the case, need to be fixed somewhere within the cavity, and, for this purpose, it is necessary to secure extra space beside the chip within the cavity. In addition, to prevent the capillary tool from touching the wall surface of the cavity, it is necessary to make the cavity sufficiently large. These requirements inevitably make the photointerruptor as a whole unnecessarily large.

Japanese Laid-Open Patent Application No. H7-15046 discloses a light-emitting device in which a cavity whose depth is greater than the height of the LED chip is formed in the top surface of the base board so that the LED chip will be placed within that cavity. The base board has two metal conductors laid on its top surface, and one of those metal conductors is so formed as to extend to and then over the floor surface of the cavity. The LED chip is fixed, by die bonding, on the floor surface of the cavity with conductive adhesive, and thereby the bottom-surface electrode of the chip is connected to the conductor that reaches the floor surface of the cavity. On the other hand, the top-surface electrode of the chip is connected, by wire bonding, to the conductor that remains on the top surface of the base board.

In this light-emitting device, the conductor on which the wire is fixed is laid on the top surface of the base board, in contrast to the above-described photo-interruptor in which the corresponding conductor is laid on the floor surface of the cavity. This eliminates the need to secure extra wire-fixing space within the cavity, and thus makes it possible to make the cavity accordingly smaller. Instead, however, the top surface of the LED chip is kept lower than the top surface of the base board. As a result, when one end of the wire is fixed on a electrode formed on the top surface of the chip, it is possible that the lower tip of the capillary tool touches the wall surface of the cavity or the top surface of the base board around the cavity. This can be avoided by making the cavity larger, but this inevitably makes the light-emitting device as a whole unnecessarily large.

In recent years, LEDs that emit light of a relatively short wavelength, such as blue light, have been developed. Such LEDs are produced by laminating layers of gallium-nitride-based semiconductor over the surface of an insulating substrate of sapphire, and their structure requires that both an anode electrode and a cathode electrode be arranged on the top surface of an LED chip.

As disclosed in Japanese Laid-Open Patent Application No. H6-120562 for example, an LED chip of this type, which has an anode electrode and a cathode electrode both arranged on its top surface, is, when formed into a light-emitting device for practical use, fixed on a leadframe upside down and then sealed in a mold of light-permeating resin with lead terminals sticking out therefrom. FIG. 5 illustrates the light-emitting device of this Japanese Laid-Open Patent Application.

As shown in FIG. 5, this light-emitting device has an LED chip 50, which is composed of a sapphire substrate 51, an n-type GaN layer 52, a p-type GaN layer 53, an anode electrode 54, and a cathode electrode 55. The anode and cathode electrodes 54 and 55 are individually fixed on lead frames 57 with conductive adhesive 56. The entire LED chip 50 and the base portions of the lead frames 57 are sealed in a mold 58 of epoxy resin, with the tip portions of the lead frames 57 sticking out from the resin mold 58 so as to serve as lead terminals. The resin mold 58 is so shaped as to have a spherical surface at its top end so that the light emitted by the LED chip 50 will be condensed.

In practical use, this light-emitting device is mounted on the top surface of a circuit board, such as has through holes formed therein and has a conductive pattern formed on the bottom surface thereof, with the lead terminals placed through appropriate ones of those through holes. The lead terminals are then soldered, on the bottom surface of the circuit board, to the conductive pattern, and thereby the light-emitting device is fixed on the circuit board and connected to the conductive pattern at the same time. The light emitted by the LED chip 50 is exploited from the top-surface side of the circuit board.

However, in this light-emitting device, the junction surface between the semiconductor layers 52 and 53, where light emission occurs, is located below the sapphire substrate 51, and therefore it is inevitable that the emitted light is partially absorbed and deflected by the sapphire substrate 51. Thus, it is impossible to make full use of the emitted light. Moreover, it is also inevitable that this light-emitting device has a greater thickness than a conventional light-emitting device of the type that has a chip fixed simply on a base board. Furthermore, this light-emitting device is unfit for surface mounting, in which a conductive pattern is formed on the top surface of a circuit board and the light-emitting device is, on the top surface of the circuit board, fixed on the circuit board and connected to the conductive pattern by reflow soldering or a similar method.

Even an LED chip that has both electrodes arranged on its top surface can be formed into a light-emitting device that has the chip fixed simply on a base board. In that case, the LED chip is fixed, by die bonding, on the base board, and the two electrodes arranged on the top surface of the chip are individually connected, by wire bonding, to two metal conductors laid on the base board. Then, the chip, together with the two wires, is sealed in a resin mold for protection. In this way, it is possible to obtain a light-emitting device that has a structure similar to that of conventional light-emitting devices. In this light-emitting device, the emitted light is exploited directly from above, and thus it is possible to avoid the absorption or deflection of the light caused by the sapphire substrate. Moreover, this light-emitting device can be adapted for surface mounting by laying the metal conductors in such a way that they reach the bottom surface of the base board.

However, as described earlier, this structure is prone to imperfect contact caused by an external mechanical force. This can be avoided by forming a cavity in the base board and placing the LED chip in that cavity, but then, whether the wires be connected to conductors laid on the floor surface of the cavity as in the above-mentioned Japanese Laid-Open Patent Application No. H5-29650, or the wires be connected to conductors laid on the top surface of the base board that is situated at a level higher than the top surface of the chip as in the above-mentioned Japanese Laid-Open Patent Application No. H7-15046, it is necessary to make the cavity sufficiently large. This inevitably makes the light-emitting device as a whole unnecessarily large. In particular, having the structure in which the two electrodes individually require wire bonding, the light-emitting device needs to be made even larger than those with an LED chip having one electrode on its top surface and the other on its bottom surface.

SUMMARY OF THE INVENTION

An object of the present invention is to provide a small-size and easy-to-produce light-emitting device in which an LED chip having an anode electrode and a cathode electrode both arranged on its top surface is employed and that nevertheless makes highly efficient use of the emitted light and is almost free from imperfect contact.

To achieve the above object, according to the present invention, in a light-emitting device comprising a base board that has a cavity formed in and two conductors laid on its top surface, an LED chip that has two electrodes arranged on its top surface and that is placed inside the cavity of the base board, two wires that connect the two electrodes of the LED chip individually to the conductors of the base board, and light-permeating resin in which the LED chip and the two wires are sealed, the two electrodes are situated at a level substantially equal to or higher than the level at which those portions of the conductors to which the two wires are connected are situated.

By arranging the LED chip in the cavity formed in the base board, it is possible to obtain a light-emitting device that is far less susceptible to a mechanical force applied from the side. Moreover, by situating the two electrodes at a level substantially equal to or higher than the level at which the two wires are connected to the two conductors, it is possible to prevent the interference of the lower tip of the capillary tool with the wall surface of the cavity or the top surface of the base board when an end of a wire is fixed on an electrode of the LED chip. This makes it easy to perform wire bonding even with a cavity of a minimum size, and thus makes it possible to produce a small-size light-emitting device.

It is also possible to form an intermediate surface within the cavity, at a level higher than the floor surface of the cavity and lower than the top surface of the base board, and extend the conductors laid on the top surface of the base board to this intermediate surface so that the electrodes of the LED chip are connected to those portions of the conductors which are situated at the level of the intermediate surface. In this case, too, the two electrodes are situated at a level substantially equal to or higher than those portions of the conductors which are situated on the intermediate surface. It is also possible to arrange the LED chip and the two wires wholly within the cavity so that the light-emitting device will have a flat top surface.

BRIEF DESCRIPTION OF THE DRAWINGS

This and other objects and features of the present invention will become clear from the following description, taken in conjunction with the preferred embodiments with reference to the accompanied drawings in which.

DESCRIPTION OF THE PREFERRED EMBODIMENTS

Figure 1:
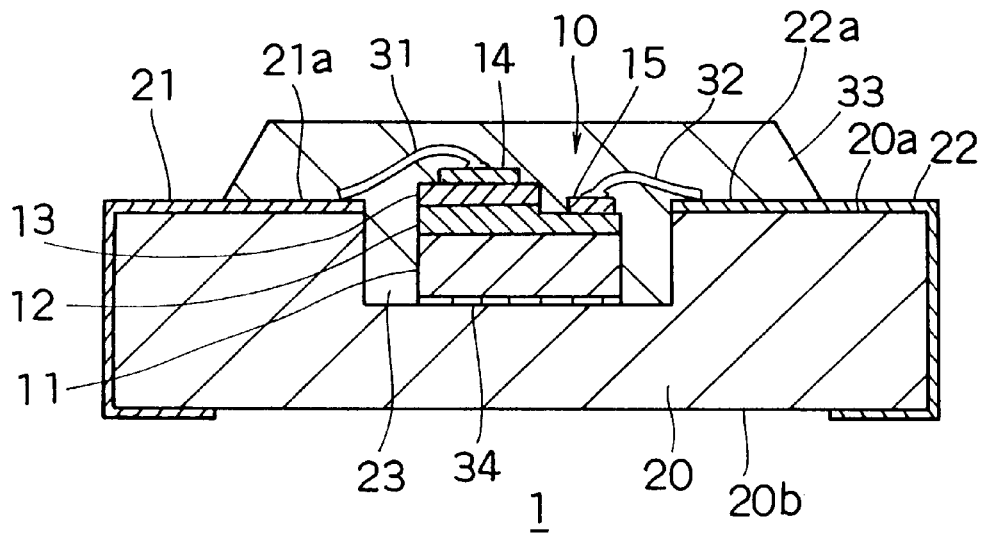
FIG. 1 is a sectional view of the light-emitting device of a first embodiment of the invention.
Figure 5:
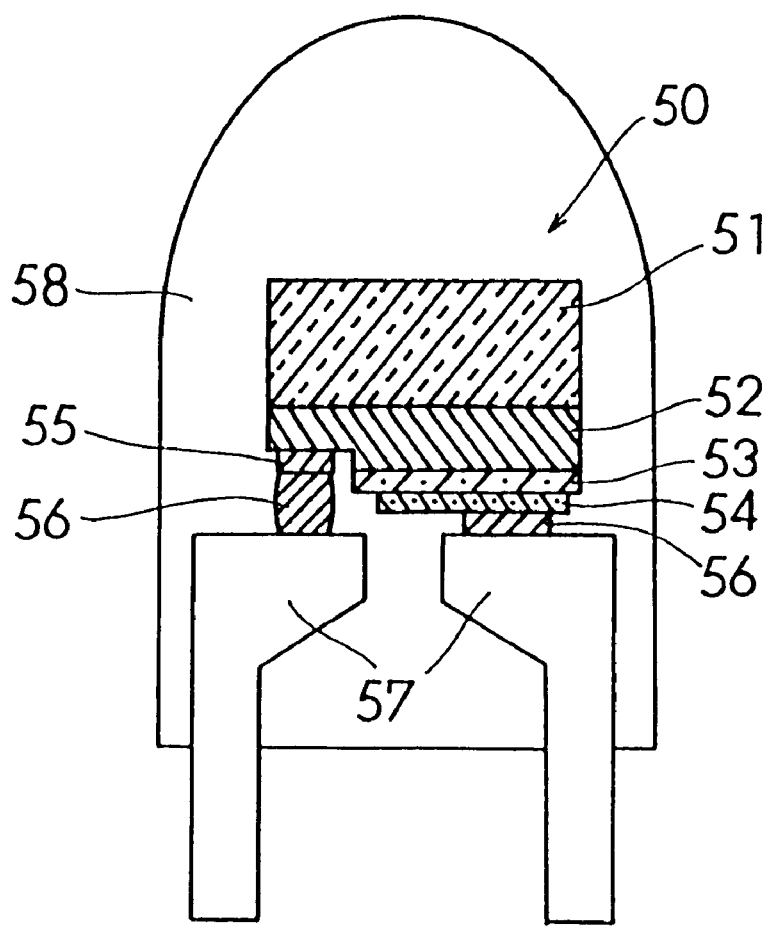
FIG. 5 is a sectional view of a conventional light-emitting device.

Hereinafter, light-emitting devices embodying the present invention will be described in detail with reference to the attached drawings. FIG. 1 shows a vertical section of the light-emitting device 1 of a first embodiment of the invention. This light-emitting device 1 is composed basically of a base board 20 having a cavity 23 formed therein, and an LED chip 10 placed inside the cavity 23. The LED chip 10 is composed of an n-type GaN layer 12 and a p-type GaN layer 13 laminated over the surface of a sapphire substrate 11; that is, except that the LED chip 10 is not placed upside down, it has a structure similar to that of the LED chip 50 shown in FIG. 5.

The n-type GaN layer 12 has part of its top surface left uncovered, and an anode electrode 14 and a cathode electrode 15 are formed on the top surface of the p-type GaN layer 13 and on the top surface of the n-type GaN layer 12, respectively. When a voltage is applied between the anode and cathode electrodes 14 and 15, the LED chip 10 emits blue light at the junction surface between the n-type GaN layer 12 and the p-type GaN layer 13.

On the top surface 20a of the base board 20 are formed a first conductor pattern 21 and a second conductor pattern 22, both of which extend further along side surfaces of the base board 20 to the bottom surface 20b thereof. Those ends 21a and 22a of the conductor patterns 21 and 22 that are situated on the top surface 20a are placed close to the cavity 23. The cavity 23 has a cylindrical shape, and its floor surface is parallel to the top surface 20a of the base board 20.

The anode electrode 14 of the LED chip 10 is connected to the top-surface-side end 21a of the first conductor pattern 21 by way of a gold wire 31. Similarly, the cathode electrode 15 of the LED chip 10 is connected to the top-surface-side end 22a of the second conductor pattern 22 by way of a gold wire 32. The anode electrode 14 is situated at a level higher than the top surface 20a of the base board 20, and the cathode electrode 15 is situated at a level substantially equal to the top surface 20a of the base board 20. The LED chip 10 and the wires 31 and 32 are sealed in a mold 33 of transparent epoxy resin, which thereby provides protection for the portion including the LED chip 10 at the center and extending radially to cover the top-surface-side ends 21a and 22a of the conductor patterns 21 and 22 to which the wires 31 and 32 are connected.

The resin mold 33 is so formed as to have a flat top surface, so that the light emitted by the LED chip 10 is shone in a wide range of directions. In cases where the light emitted by the LED chip 10 needs to be shone with a sharp directivity, the top surface of the resin mold 33 is shaped into a curved surface, instead of a flat surface, so that it will serve as a condensing lens. For example, to obtain a conical light beam whose center axis is perpendicular to the base board 20, the top surface is shaped into a spherical surface; to obtain a light beam that diverge only to the right and to the left, the top surface is shaped into a cylindrical surface that extends from right to left. It is preferable that the resin mold 33 be made of a material whose thermal expansion coefficient is substantially equal to that of the base board 20. This helps reduce effectively the occurrence of imperfect contact at the joint between the resin mold 33 and the base board 20.

Figure 2:
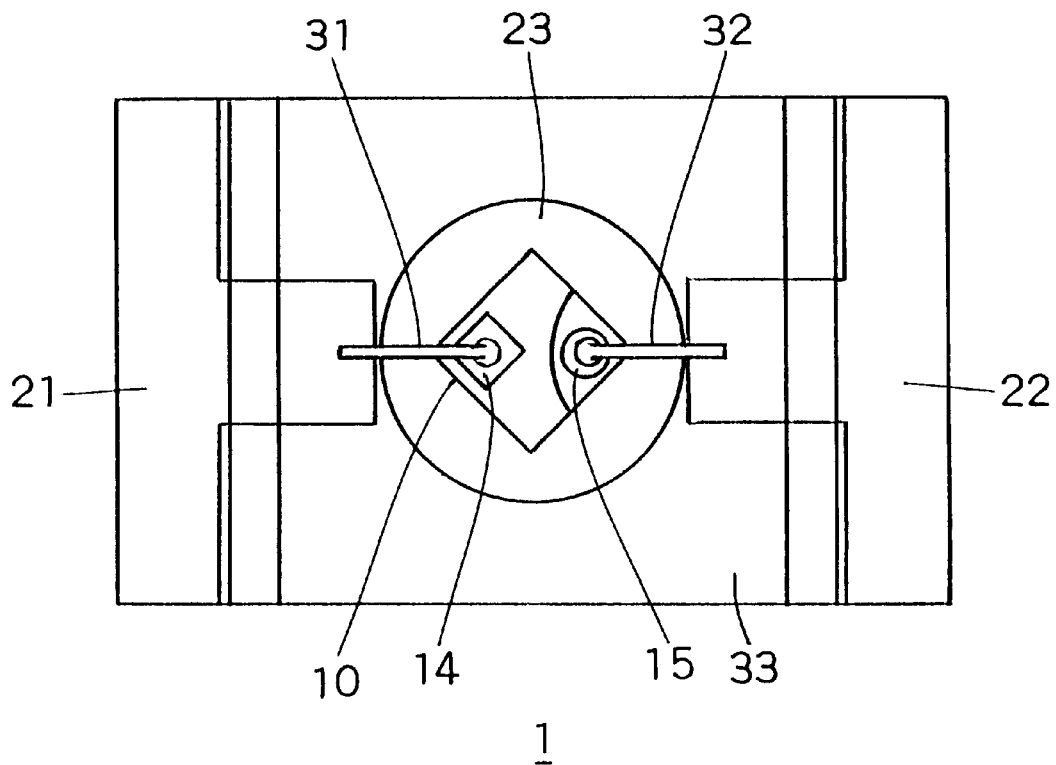
FIG. 2 is a plan view of the light-emitting device of the first embodiment.

FIG. 2 shows a plan view of the light-emitting device 1. In this embodiment, the cavity 23 is so shaped as to have a circular horizontal section; however, it may be so shaped as to have a rectangular horizontal section and have wall surfaces each facing one of the side surfaces of the LED chip 10. Moreover, the two conductor patterns 21 and 22 may be formed in any shape and in any direction.

The light-emitting device 1 is produced in the following manner. First, in the top surface of a large mother base board, which will later be divided into a large number of individual base boards 20, a large number of hollows, which will later be used as cavities 23, are formed. Then, on the top and bottom surfaces of the mother base board, conductor patterns, which will later be used as conductor patterns 21 and 22, are formed by a known method such as vapor deposition. Next, a large number of LED chips 10 are die-bonded; that is, an LED chip 10 is fixed lightly on the floor surface of each cavity 23 with adhesive 34, with the bottom surface of the LED chip 10 facing the base board 20.

Then, for each LED chip 10, wire bonding is performed; that is, the anode and cathode electrodes 14 and 15 of the LED chip 10 are respectively connected to the corresponding conductor patterns by way of wires 31 and 32. Thereafter, resin, in its liquid state, is applied to the cavity in which the LED chip 10 is placed and to the area around the cavity so that the LED chip 10 and the wires 31 and 32 will be sealed therein. The resin is then hardened by application of heat, and is thereby formed into a resin mold 33.

The mother base board is then cut apart into individual light-emitting devices 1. Subsequently, in each light-emitting device, the conductor patterns formed on its top and bottom surfaces are connected together on the side surfaces of the base board 20, and are thereby formed into the conductor patterns 21 and 22 in their completed form. This marks the completion of the production of the light-emitting device 1. In the above description, the hollows that will later be used as the cavities 23 are formed by removing parts of the top surface of the mother base board; however, it is also possible to form the mother base board by joining together a board having a large number of through holes and a board having no holes and use those holes, now having an opening only at one end thereof, as cavities 23. It is also possible to prepare base boards 20 having the conductor patterns 21 and 22 ready in their completed form, and fix LED chips 10 individually thereon. This, however, is not preferable from the viewpoint of production efficiency.

The adhesive 34 is used simply to keep the LED chip 10 in position on the base board 20 during wire bonding and molding, and therefore it does not necessarily have to be capable of rigidly fixing the LED chip 10. After the formation of the resin mold 33, the resin adheres to the base board 20, and thereby keeps the LED chip 10 in position. The adhesive may be of a non-conductive type. To achieve even distribution of light intensity, the resin mold 33 may contain particles for scattering light.

In the light-emitting device 1, the portion of the LED chip 10 where light emission occurs faces the side from which the emitted light is exploited, and therefore the loss of light due to the chip substrate 11 is minimal. Thus, this light-emitting device 1 permits efficient use of the emitted light, and achieves bright illumination with lower power consumption and with lower heat radiation. Moreover, since the resin mold 33 is so formed that a part thereof fills the cavity 23, it is far less susceptible to a mechanical force applied from the side. Accordingly, even if a mechanical force is applied from the side, it is unlikely that the resin mold 33 or the LED chip 10 will be separated from the base board 20. Thus, an external mechanical force seldom results in imperfect electrical contact.

Moreover, the electrodes 14 and 15 are situated at a level substantially equal to or higher than the top surface 20a of the base board 20. This helps prevent the lower tip of the capillary tool from touching the wall surface of the cavity 23 or the top surface 20a of the base board 20 when one end of the wire 31 or 32 is fixed on the electrode 14 or 15. Thus, wire bonding can be performed with ease. The spot at which the other end of the wire 31 or 32 is fixed on the conductor pattern 21 or 22 may be situated at any position, and therefore those fixing spots can be situated sufficiently away from the LED chip 10. This helps prevent the capillary tool from touching the LED chip 10 when this end of the wire 31 or 32 is fixed on the conductor pattern 21 or 22.

In this light-emitting device 1, the conductor patterns 21 and 22 that are connected to the electrodes 14 and 15 are so laid as to reach the bottom surface 20b of the base board. Accordingly, it is possible, simply by fixing the light-emitting device 1 on the surface of a circuit board by flow soldering or a similar method, to connect it to the pattern of a circuit formed on the top surface of the circuit board; that is, it can be surface-mounted. This makes it easy to produce a display device by mounting a plurality of light-emitting devices 1 on a single circuit board; in particular, when the driver circuits used to drive those light-emitting devices are also adapted for surface mounting, mounting can be performed highly efficiently.

Figure 3:
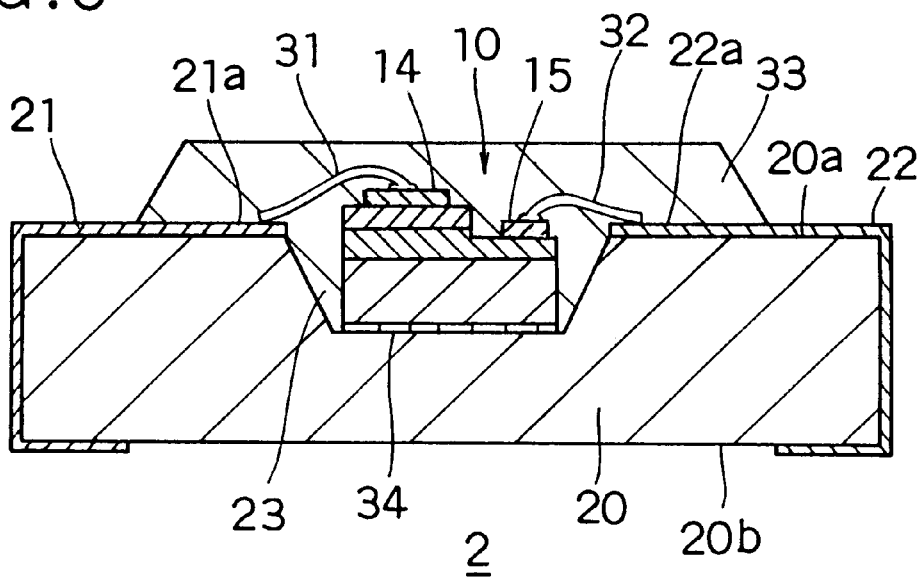
FIG. 3 is a sectional view of the light-emitting device of a second embodiment of the invention.

FIG. 3 shows a vertical section of the light-emitting device 2 of a second embodiment of the invention. In the following description, such constituent elements as are found also in the light-emitting device 1 of the first embodiment will be identified with the same reference numbers, and overlapping explanations will not be repeated. The light-emitting device 2 of the second embodiment differs from the light-emitting device 1 of the first embodiment only in that the diameter of the cavity 23 increases toward the top surface 20a of the base board 20, that is, the cavity 23 has a slant wall surface. By forming the cavity 23 into the shape of a truncated cone in this way, it is possible to form the cavity 23 with more ease by the removal of a part of the base board, and also reduce the amount of resin required to form the resin mold 33.

Figure 4:
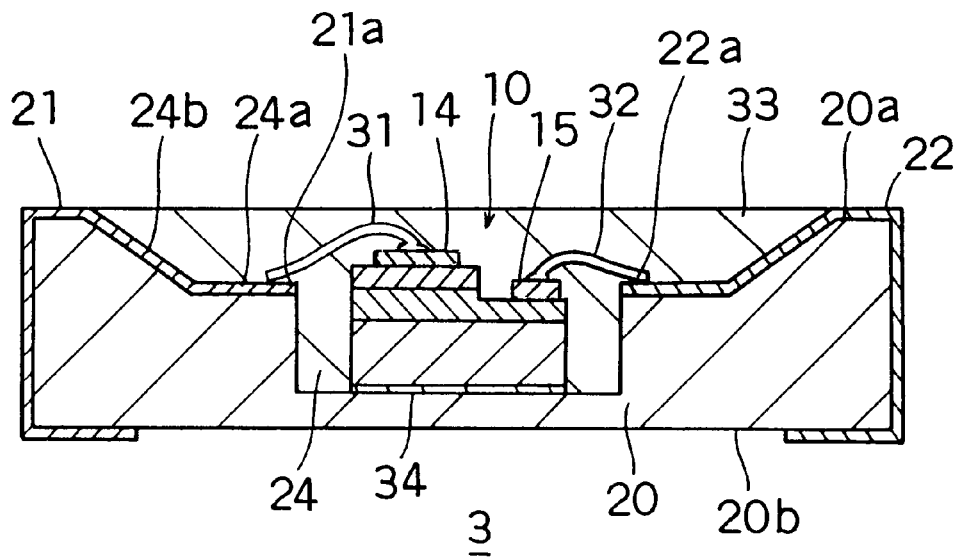
FIG. 4 is a sectional view of the light-emitting device of a third embodiment of the invention.

FIG. 4 shows a vertical section of the light-emitting device 3 of a third embodiment of the invention. This light-emitting device 3 also has a cavity 24 formed in its base board 20. However, here, the cavity 24 is so formed as to be deeper than the cavity 23 of the light-emitting device 1 or 2, and the wires 31 and 32 are so arranged that their topmost portions are situated below the top surface 20a of the base board 20. Moreover, the cavity 24 additionally has a shallow flat portion 24a, and also has a slant portion 24b leading to the top surface 20a of the base board 20. The conductor patterns 21 and 22 are so formed as to extend from the top surface 20a of the base board 20 along the slant portion 24b to the flat portion 24a, and those ends 21a and 22a of the conductor patterns at which they are connected to the wires 31 and 32 are situated on the flat portion 24a.

The anode electrode 14 of the LED chip 10 is situated at a level higher than the flat portion 24a, and the cathode electrode 15 thereof is situated at a level substantially equal to the flat portion 24a. This, just as in the light-emitting device 1 of the first embodiment, helps prevent the lower tip of the capillary tool from touching the wall surface of the cavity 24 or the top surface of the flat portion 24a when one end of the wire 31 or 32 is fixed on the electrode 14 or 15.

The resin 33 is applied only within the cavity 24 so that the resin mold 33 will have its top surface at a level substantially equal to the top surface 20a of the base board 20. Accordingly, the light-emitting device 3 has a flat surface substantially all over its top surface, and thus has no portion protruding from the top surface 20a of the base board 20.

This light-emitting device 3 can be made thinner than the light-emitting device 1, and can protect the LED chip 10 perfectly from a mechanical force applied from the side. Moreover, since the wires 31 and 32 are also arranged wholly within the cavity 24, there is no possibility that they are broken by an external mechanical force.

In this structure, the portion of the LED chip 10 where light emission occurs is situated below the top surface 20a of the base board 20, and therefore the emitted light is inevitably shone in a comparatively limited range of directions. However, the range of directions in which the emitted light is shone can be widened easily by forming the shallow flat portion 24a at a level lower than the light-emitting junction surface and by forming the slant portion 24b so as to cover as wide an area as possible around the cavity 24.

Obviously, many modifications and variations of the present invention are possible in light of the above teachings. It is therefore to be understood that within the scope of the appended claims, the invention may be practiced other than as specifically described.

What is claimed is:

1. A light-emitting device comprising:

a base board that has a cavity formed in and two conductors laid on a top surface thereof;

a light-emitting diode chip disposed inside the cavity of the base board, said light-emitting diode chip having two electrodes arranged on a top surface thereof;

two wires that connect the two electrodes of said light-emitting diode chip individually to the conductors of said base board; and light-permeating resin in which said light-emitting diode chip and said two wires are sealed, wherein said cavity has a floor surface that is substantially parallel to the top surface of said base board, and on which said light-emitting diode chip is fixed, and has an intermediate surface that is substantially parallel to the top surface of said base board and that is situated at a level which is higher than said floor surface, wherein said two conductors extend from the top surface of said base board to said intermediate surface, and wherein said two wires connect said two electrodes to those portions of said two conductors which are situated on said intermediate surface.

2. A light-emitting device as claimed in claim 1, wherein said two conductors both extend to a bottom surface of said base board.

3. A light-emitting device as claimed in claim 1, wherein said cavity has a slant surface that extends from said intermediate surface to the top surface of said base board, and wherein said two conductors extend from the top surface of said base board to said intermediate surface by way of said slant surface.

4. A light-emitting device as claimed in claim 1 wherein said two wires are arranged wholly below the top surface of said base board, and wherein said resin is applied only within and evenly throughout said cavity, with a top surface thereof kept at a level substantially equal to the top surface of said base board.

5. A light-emitting device as claimed in claim 1, wherein said base board and said resin have substantially identical thermal expansion coefficients.

6. A light-emitting device as claimed in claim 1, wherein said two wires are fixed by wire bonding with first bonding sides on said two electrodes and second bonding sides on said two conductors.

7. A light-emitting device as claimed in claim 1, wherein said two electrodes are situated at levels which are substantially equal to or higher than a level of said intermediate surface.

* * * * *